(12) United States Patent
Nishizaki

(10) Patent No.: US 11,984,188 B2
(45) Date of Patent: May 14, 2024

(54) SEMICONDUCTOR DEVICE HAVING SENSE AMPLIFIER

(71) Applicant: MICRON TECHNOLOGY, INC., Boise, ID (US)

(72) Inventor: Mamoru Nishizaki, Yokohama (JP)

(73) Assignee: Micron Technology, Inc., Boise, ID (US)

(*) Notice: Subject to any disclaimer, the term of this patent is extended or adjusted under 35 U.S.C. 154(b) by 207 days.

(21) Appl. No.: 17/733,746

(22) Filed: Apr. 29, 2022

(65) Prior Publication Data

US 2023/0352061 A1 Nov. 2, 2023

(51) Int. Cl.
| | |
|---|---|
| *G11C 5/06* | (2006.01) |
| *G11C 11/4091* | (2006.01) |
| *H10B 12/00* | (2023.01) |
| G11C 11/4094 | (2006.01) |
| H01L 23/522 | (2006.01) |
| H01L 23/528 | (2006.01) |

(52) U.S. Cl.
CPC .......... *G11C 5/063* (2013.01); *G11C 11/4091* (2013.01); *H10B 12/50* (2023.02); *G11C 11/4094* (2013.01); *H01L 23/5225* (2013.01); *H01L 23/5226* (2013.01); *H01L 23/5286* (2013.01)

(58) Field of Classification Search
CPC . G11C 5/063; G11C 11/4091; G11C 11/4094; H10B 12/50
See application file for complete search history.

(56) References Cited

U.S. PATENT DOCUMENTS

2007/0253267 A1* 11/2007 Nobutoki ............ G11C 11/4097
365/207
2012/0134192 A1* 5/2012 Lee ..................... H01L 27/0207
365/51

\* cited by examiner

*Primary Examiner* — Han Yang
(74) *Attorney, Agent, or Firm* — Dorsey & Whitney LLP

(57) ABSTRACT

Disclosed herein is an apparatus that includes a first wiring layer including a first bit line extending in a first direction, a first sense amplifier configured to amplify a potential of the first bit line, and a first transistor configured to supply an operation voltage to the first sense amplifier when a first control signal supplied to a gate electrode of the first transistor is activated. The first wiring layer further includes a first pattern coupled to the gate electrode of the first transistor and a second pattern having a first section arranged between the first bit line and the first pattern in a second direction perpendicular to the first direction.

26 Claims, 14 Drawing Sheets

SEMICONDUCTOR DEVICE HAVING SENSE AMPLIFIER

BACKGROUND

Read data that are read from memory cells to bit lines are respectively amplified by associated sense amplifiers in a semiconductor memory device such as a DRAM (Dynamic Random Access Memory). The sense amplifiers are activated responsive to a control signal. The read data on the bit lines are weak. Accordingly, if a wiring pattern supplied with the control signal and the bit lines are coupled, the level of the bit lines fluctuates due to a change of the control signal, resulting in a reduction of sense margin. Therefore, it is desired that the wiring pattern supplied with the control signal and the bit lines are designed so as not to be coupled to each other.

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
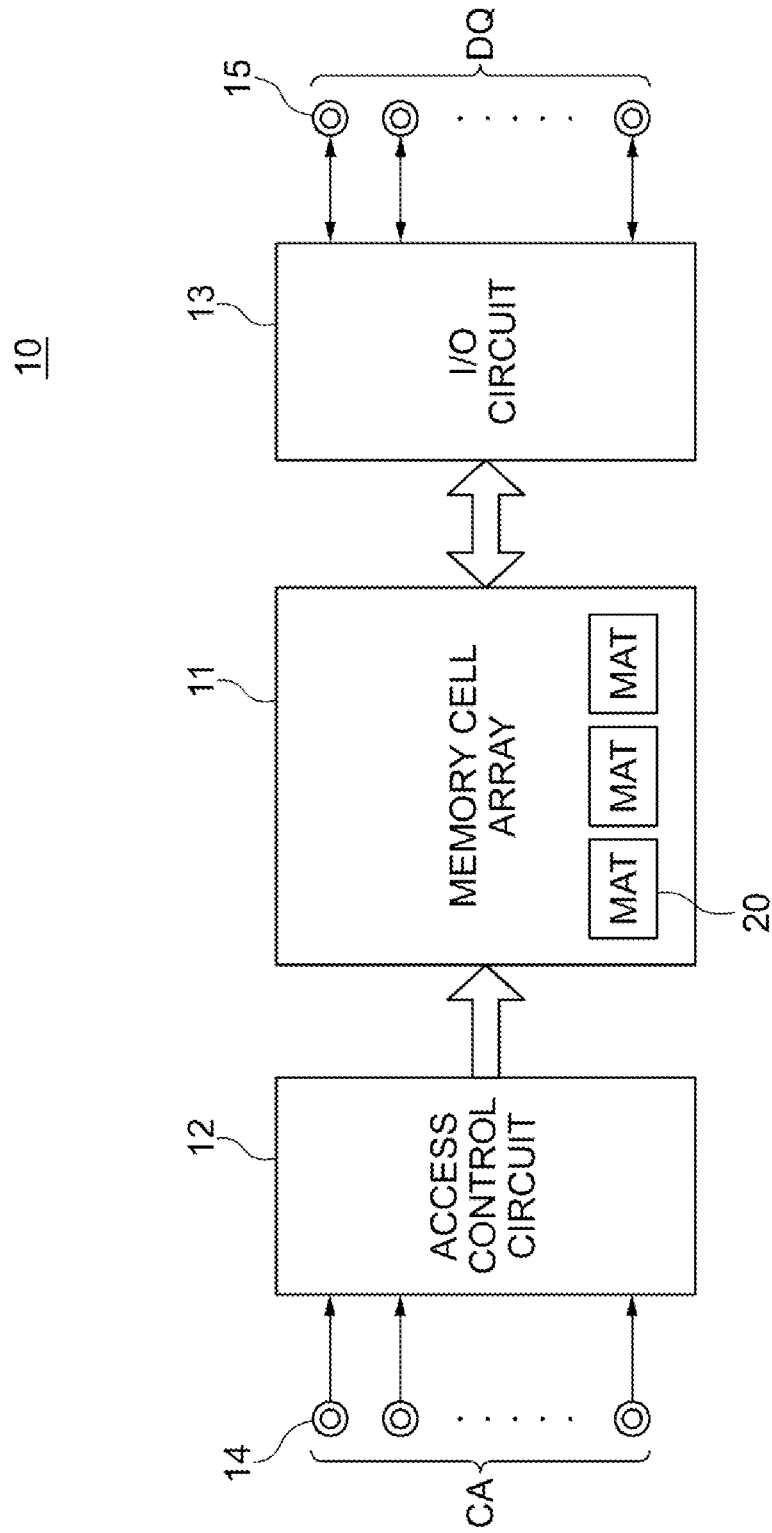
FIG. 1 is a block diagram showing a configuration of a semiconductor device according to the present disclosure.

FIG. 1 is a block diagram showing a configuration of a semiconductor device 10 according to the present disclosure. The semiconductor device 10 shown in FIG. 1 is, for example, a DRAM and includes a memory cell array 11, an access control circuit 12 performing access to the memory cell array 11, and an I/O circuit 13 performing input/output of data to/from the memory cell array 11. The access control circuit 12 performs access to the memory cell array 11 on the basis of a command address signal CA input from an external controller via a command address termina 14. At the time of a read operation, data DQ read from the memory cell array 11 is output to a data I/O terminal 15 via the I/O circuit 13. At the time of a write operation, data DQ input from an external controller to the data I/O terminal 15 is written into the memory cell array 11 via the I/O circuit 13. The memory cell array 11 includes a plurality of memory mats 20.

Figure 2:
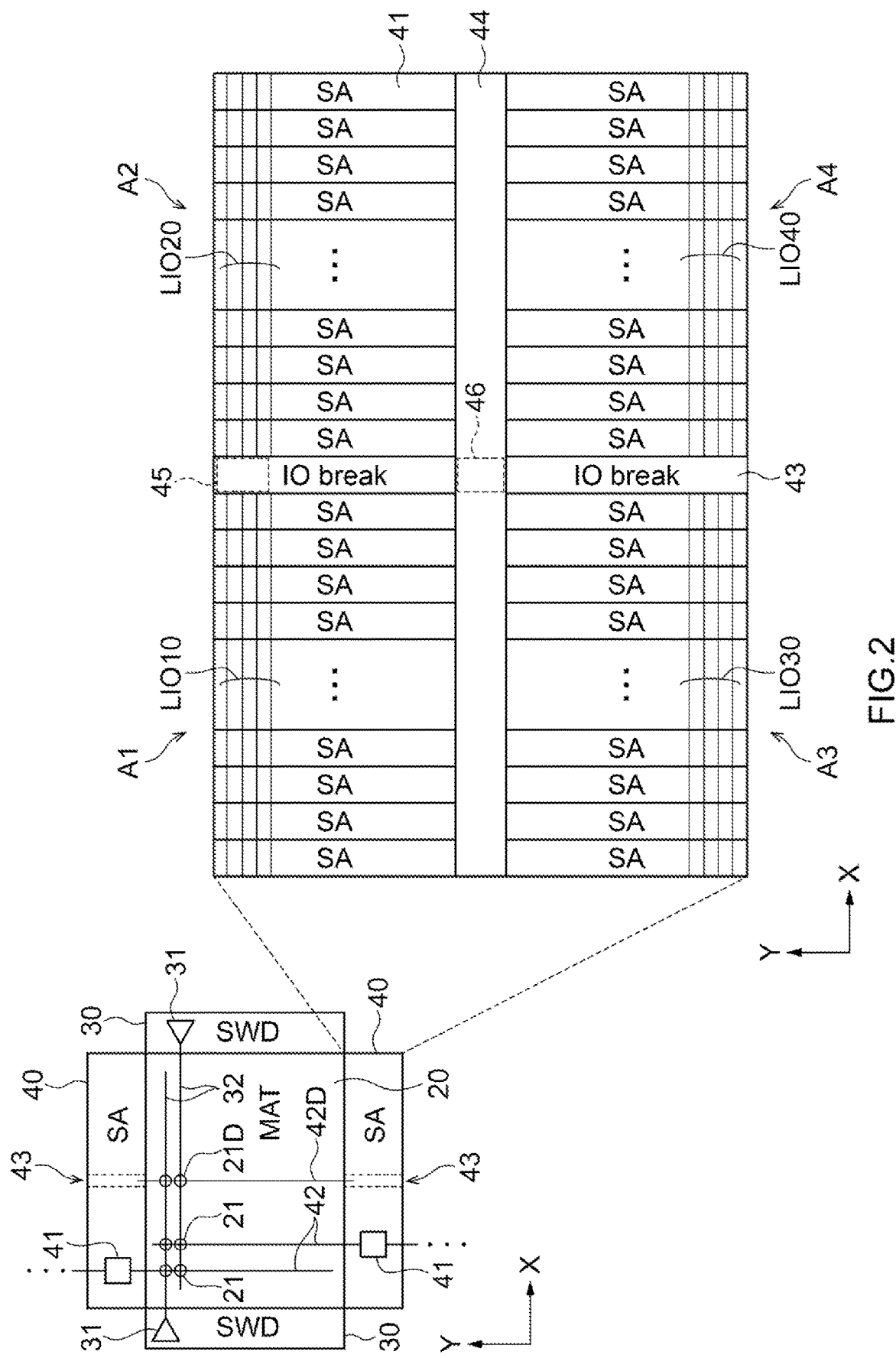
FIG. 2 is a schematic diagram for explaining a structure of memory mats.

FIG. 2 is a schematic diagram for explaining a structure of the memory mats 20. As shown in FIG. 2, each of the memory mats 20 includes a plurality of memory cells 21. A sub word driver region 30 is arranged on both sides of each of the memory mats 20 in an X direction. A sense amplifier region 40 is arranged on both sides of each of the memory mats 20 in a Y direction. A plurality of sub word drivers 31 are arranged in the sub word driver region 30. Each of the sub word drivers 31 activates an associated one of word lines 32. A plurality of sense amplifiers 41 are arranged in the sense amplifier region 40. Each of the sense amplifiers 41 is coupled to an associated pair of bit lines 42. When a predetermined word line 32 is activated, a plurality of the memory cells 21 associated thereto are connected to associated ones of the bit lines 42, respectively. Read data that are read to the bit lines 42 are amplified by associated ones of the sense amplifiers 41, respectively.

There is an I/O break region 43 in a central part of the sense amplifier region 40 in the X direction. The I/O break region 43 is a region where no sense amplifiers 41 are arranged. Accordingly, the sense amplifier region 40 is divided by the I/O break region 43 into circuit regions A1 and A3, and circuit regions A2 and A4. A bit line associated with the I/O break region 43 is a dummy bit line 42D. Memory cells coupled to the dummy bit line 42D are dummy memory cells 21D that are not used to store data. There is a driver region 44 in a central part of the sense amplifier region 40 in the Y direction. Driver transistors to activate the sense amplifiers 41 are arranged in the driver region 44. Accordingly, the sense amplifier region 40 is divided by the driver region 44 into the circuit regions A1 and A2, and the circuit regions A3 and A4. Local I/O lines LIO10, LIO20, LIO30, and LIO40 are arranged on the circuit regions A1 to A4, respectively. In the example shown in FIG. 2, each of the local I/O lines LIO10, LIO20, LIO30, and LIO40 includes four local I/O lines.

Figure 3:
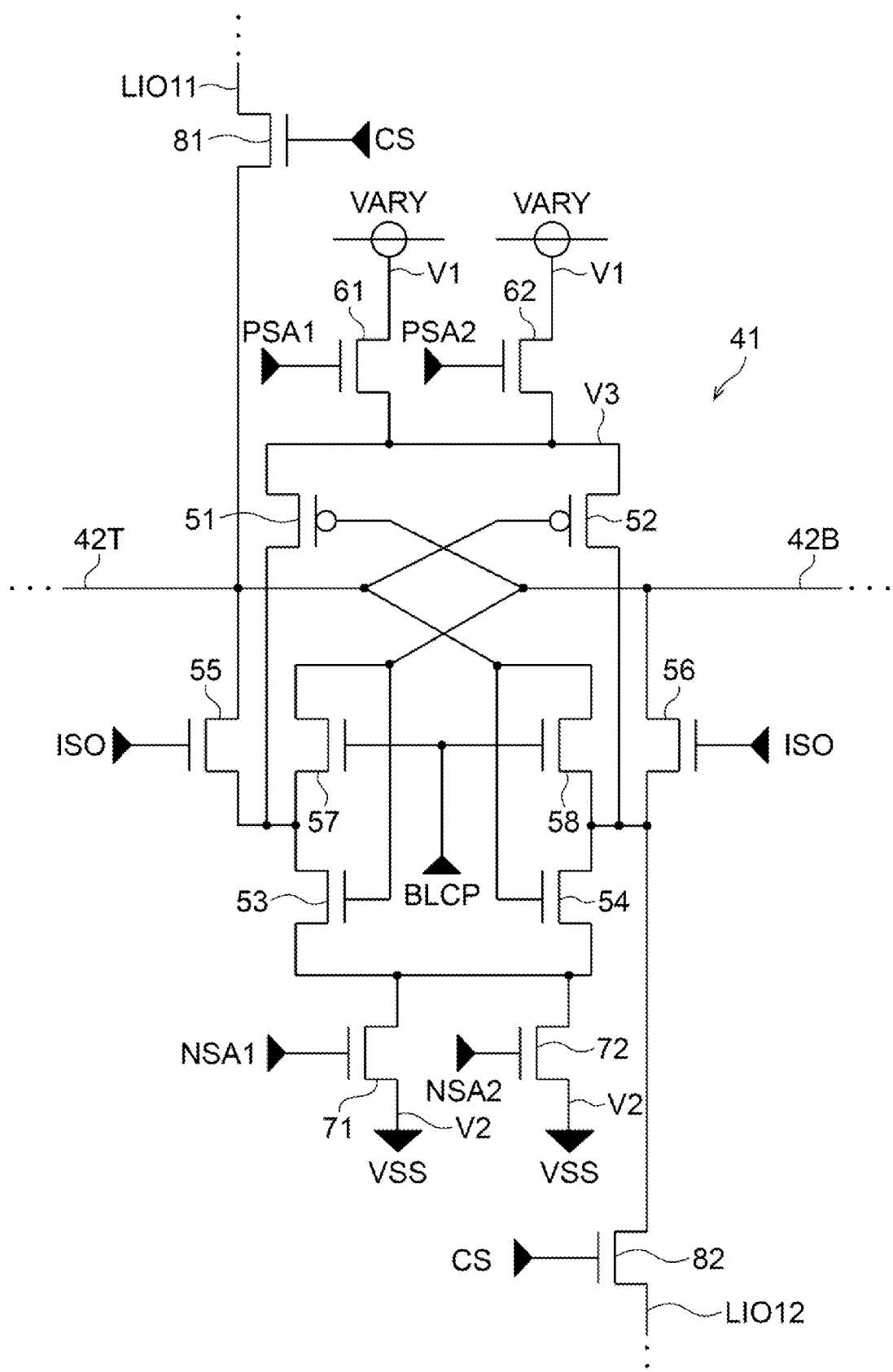
FIG. 3 is a circuit diagram of sense amplifiers.

FIG. 3 is a circuit diagram of the sense amplifiers 41. Each of the sense amplifiers 41 includes P-channel MOS transistors 51 and 52 and N-channel MOS transistors 53 and 54 constituting a flip-flop circuit. Each of the sense amplifiers 41 amplifies a potential difference between a pair of bit lines 42T and 42B. The bit line 42T is coupled to gate electrodes of the transistors 52 and 54 and is also coupled to drains of the transistors 51 and 53 via an N-channel MOS transistor 55. The bit line 42B is coupled to gate electrodes of the transistors 51 and 53 and is also coupled to drains of the transistors 52 and 54 via an N-channel MOS transistor 56. A control signal ISO is supplied to gate electrodes of the transistors 55 and 56. An N-channel MOS transistor 57 is coupled between the drains of the transistors 51 and 53 and the bit line 42B. An N-channel MOS transistor 58 is coupled between the drains of the transistors 52 and 54 and the bit line 42T. A control signal BLCP is supplied to gate electrodes of the transistors 57 and 58.

Sources of the transistors 51 and 52 are coupled to a power supply line V1, which is supplied with an array potential VARY, via a common source wiring V3 and two N-channel MOS transistors 61 and 62 coupled in parallel, respectively. Control signals PSA1 and PSA2 are supplied to gate electrodes of the transistors 61 and 62, respectively. Sources of the transistors 53 and 54 are coupled to a power supply line V2, which is supplied with a ground potential VSS, via two N-channel MOS transistors 71 and 72 coupled in parallel, respectively. Control signals NSA1 and NSA2 are supplied to gate electrodes of the transistors 71 and 72, respectively. With this circuit configuration, when at least one of the control signals PSA1 and PSA2 is activated to a high level and at least one of the control signals NSA1 and NSA2 is activated to a high level, a potential difference between the bit lines 42T and 42B is amplified and one of the bit lines 42T and 42B is brought to the array potential VARY while the other is brought to the ground potential VSS. The bit line 42T is coupled to an associated local I/O line LIO11 via an N-channel MOS transistor 81 being a column switch. The bit line 42B is coupled to an associated local I/O line LIO12 via an N-channel MOS transistor 82 being a column switch. An associated column selection signal CS is supplied to gate electrodes of the transistors 81 and 82.

Figure 4:
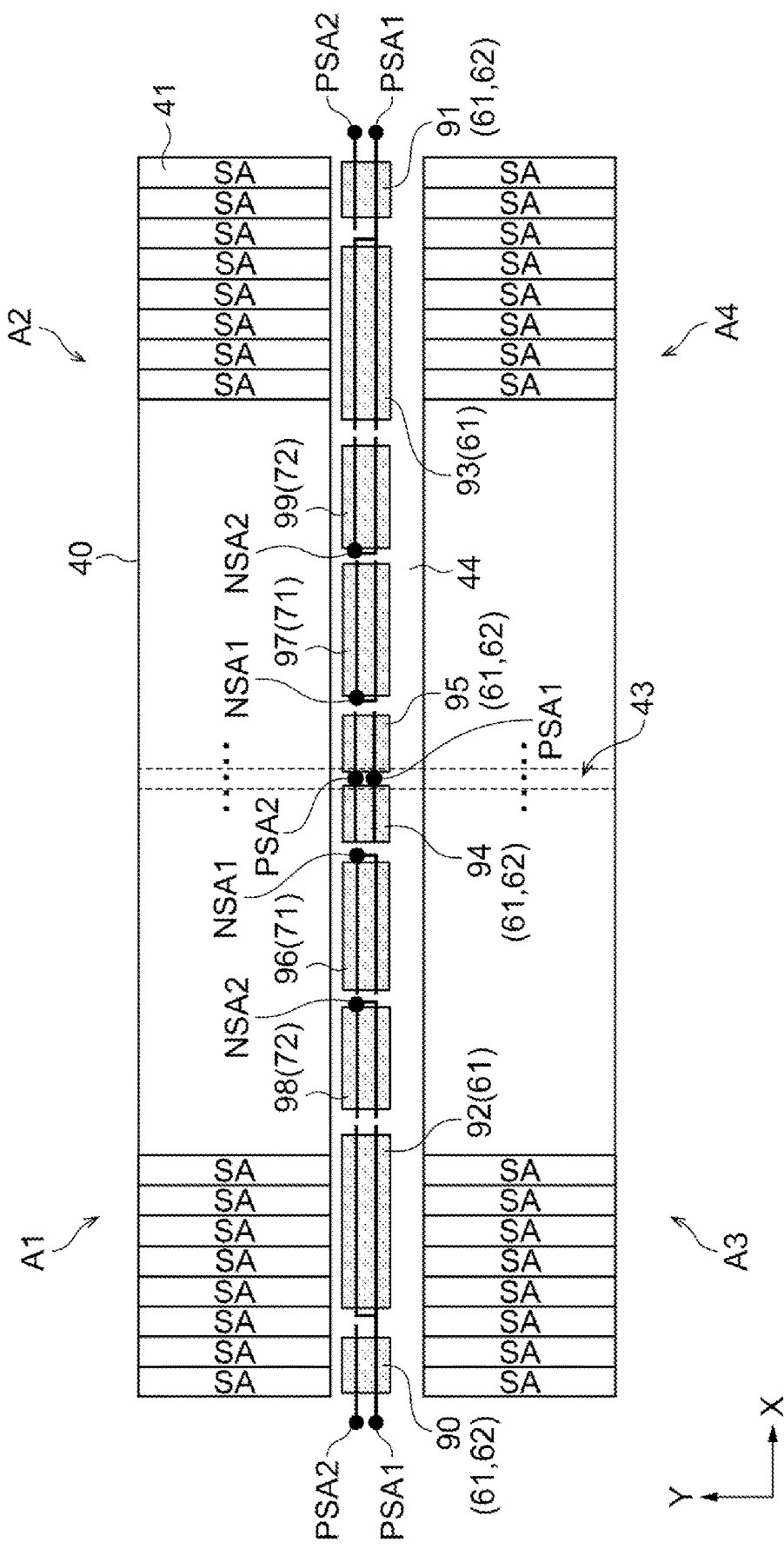
FIG. 4 is a schematic diagram for explaining a layout of transistors arranged in a driver region.

FIG. 4 is a schematic diagram for explaining a layout of the transistors arranged in the driver region 44. As shown in FIG. 4, active regions 90 to 99 are arranged in the driver region 44. Two gate electrodes covering the active regions 90, 91, 94, and 95 are supplied with the control signals PSA1 and PSA2, respectively. Two gate electrodes covering the active regions 92 and 93 are both supplied with the control signal PSA1. Two gate electrodes covering the active regions 96 and 97 are both supplied with the control signal NSA1. Two gate electrodes covering the active regions 98 and 99 are both supplied with the control signal NSA2. Accordingly, the active regions 90, 91, 94, and 95 constitute the transistors 61 and 62, the active regions 92 and 93 constitute the transistor 61, the active regions 96 and 97 constitute the transistor 71, and the active regions 98 and 99 constitute the transistor 72. Black circles shown in FIG. 4 indicate locations of via conductors for supplying associated control signals from an upper wiring layer to a lower wiring layer, respectively. As shown in FIG. 4, via conductors supplying the control signals PSA1 and PSA2 to the gate electrodes covering the active regions 90 to 93 are positioned outside the sense amplifier region 40. Via conductors supplying the control signals PSA1 and PSA2 to the gate electrodes covering the active regions 94 and 95 are positioned on the I/O break region 43.

Figure 5A:
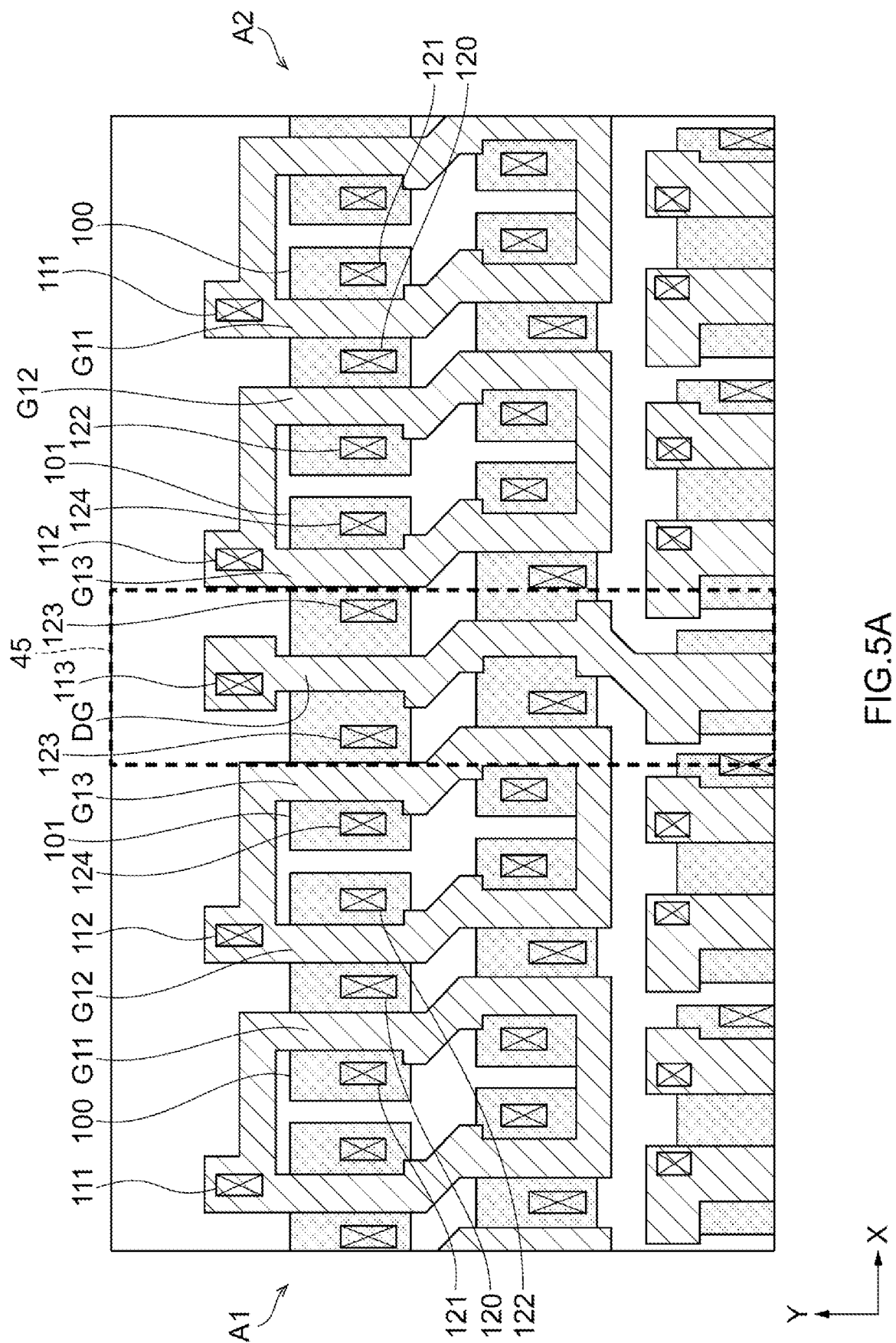
FIGS. 5A to 5D are plan views for explaining a layout of a region shown in FIG. 2 and a peripheral area.
Figure 5B:
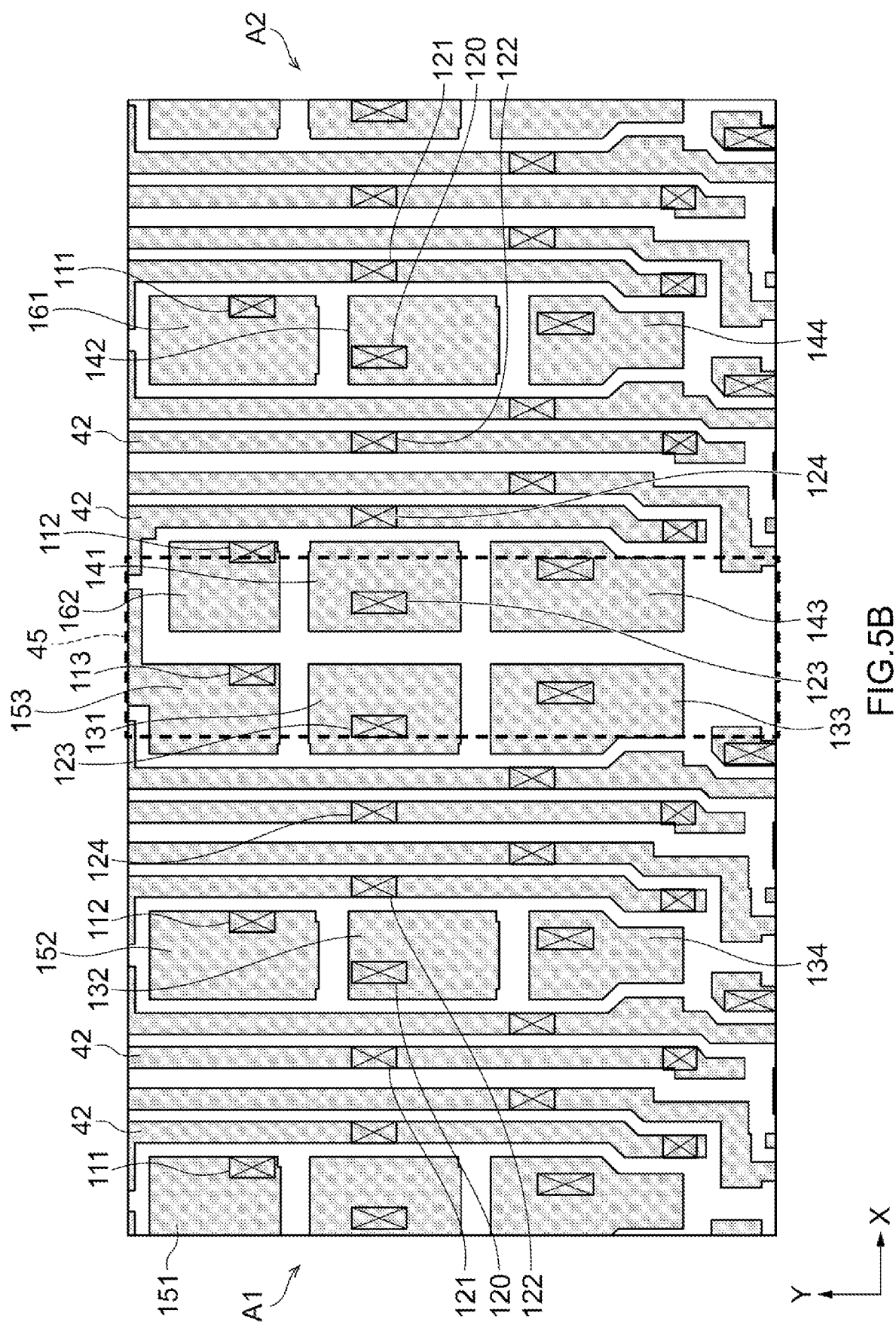
Figure 5C:
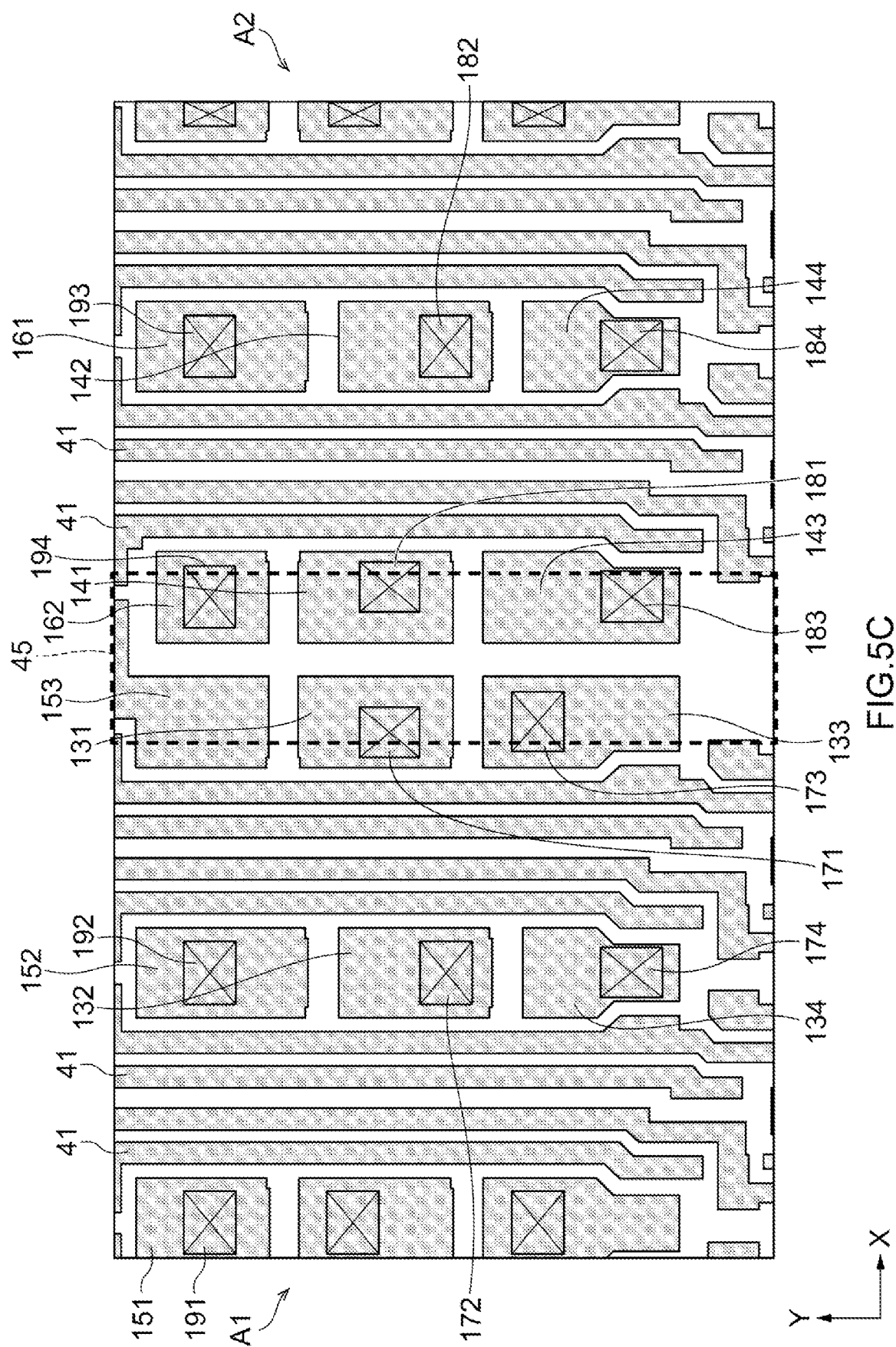
Figure 5D:
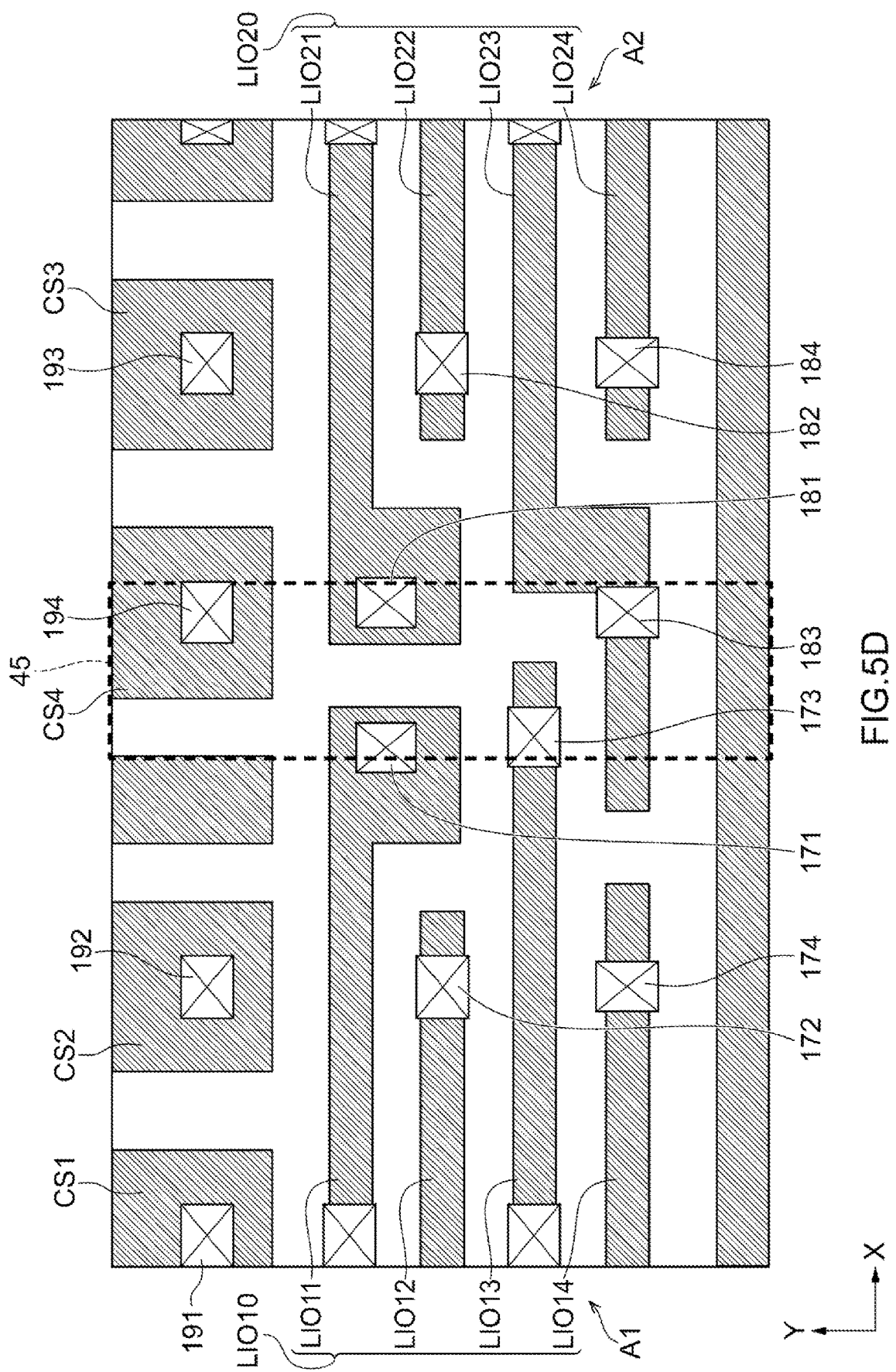

FIGS. 5A to 5D are plan views for explaining a layout of a region 45 shown in FIG. 2 and a peripheral area. The region 45 is positioned on an end of the I/O break region 43 in the Y direction. FIG. 5A shows a layout of diffusion layers and gate electrodes, FIGS. 5B and 5C show a layout of a wiring layer M0 positioned in a lowermost layer, and FIG. 5D shows a layout of a wiring layer M1 positioned above the wiring layer M0. Via conductors coupling the wiring layer M0 to the diffusion layers or the gate electrodes are shown in FIG. 5B, and via conductors coupling the wiring layer M0 to the wiring layer M1 are shown in FIG. 5C.

As shown in FIG. 5A, transistors constituting column switches are arranged on the end of the sense amplifier region 40 in the Y direction. In the transistors constituting the column switches, two gate electrodes G11 and G12 are allocated to one active region 100 except for a portion adjacent to the I/O break region 43. The gate electrodes G11 and G12 are coupled to the wiring layer M0 through via conductors 111 and 112, respectively. A source/drain region positioned between the gate electrodes G11 and G12 in each of the active regions 100 in a planar view is coupled to the wiring layer M0 through a via conductor 120. The via conductor 120 is coupled to a local I/O line LIO. Source/drain regions of each of the active regions 100 positioned on both sides in the X direction are coupled to associated ones of the bit lines 42 provided on the wiring layer M0 through via conductors 121 and 122, respectively. In this way, in the transistors constituting the column switches, one local I/O line LIO is shared by two bit lines 42 except for a portion adjacent to the I/O break region 43. In contrast thereto, in column switches adjacent to the I/O break region 43, one gate electrode G13 is allocated to one active region 101. The gate electrode G13 is coupled to the wiring layer M0 through a via conductor 112. A source/drain region positioned on the side of the I/O break region 43 in each of the active regions 101 is coupled to the wiring layer M0 through a via conductor 123. The via conductor 123 is coupled to a local I/O line LIO. A source/drain region positioned on the opposite side to the I/O break region 43 in each of the active regions 101 is coupled to an associated one of the bit lines 42 provided on the wiring layer M0 through a via conductor 124. In this way, the active regions 101 of the transistors constituting the column switches are separated by the I/O break region 43. Accordingly, two transistors adjacent to the I/O break region 43 do not share one local I/O line LIO and are coupled to different local I/O lines LIO, respectively. A dummy gate electrode DG is arranged between two active regions 101 positioned on opposite sides across the I/O break region 43. The dummy gate electrode DG is coupled to the wiring layer M0 through a via conductor 113.

As shown in FIG. 5B, conductive patterns 131 to 134 and 151 to 153 and a plurality of bit lines 42 extending in the Y direction are provided on the wiring layer M0 positioned in the circuit region A1. The conductive patterns 131 to 134 and the bit lines 42 are coupled to the source/drain regions of the column switches through associated via conductors, respectively. The conductive patterns 151 and 152 are coupled to the gate electrodes of the column switches through the via conductors 111 and 112, respectively. The conductive pattern 153 is coupled to the dummy gate electrode DG through the via conductor 113. The level of the dummy gate electrode DG is fixed to an intermediate potential VBLP. Similarly, conductive patterns 141 to 144, 161, and 162 and a plurality of bit lines 42 extending in the Y direction are provided on the wiring layer M0 positioned in the circuit region A2. The conductive patterns 141 to 144 and the bit lines 42 are coupled to the source/drain regions of the column switches through associated via conductors, respectively. The conductive patterns 161 and 162 are coupled to the gate electrodes of the column switches through the via conductors 111 and 112, respectively.

As shown in FIGS. 5C and 5D, the conductive patterns 131 to 134 provided on the wiring layer M0 are coupled to local I/O lines LIO11 to LIO14 located on the wiring layer M1 through via conductors 171 to 174, respectively. The local I/O lines LIO11 to LIO14 constitute the four local I/O lines LIO10 included in circuit region A1 shown in FIG. 2. Similarly, the conductive patterns 141 to 144 provided on the wiring layer M0 are coupled to local I/O lines LIO21 to LIO24 located on the wiring layer M1 through via conductors 181 to 184, respectively. The local I/O lines LIO21 to LIO24 constitute the four local I/O lines LIO20 included in circuit region A2 shown in FIG. 2. Furthermore, the conductive patterns 151, 152, 161, and 162 provided on the wiring layer M0 are coupled to column selection lines CS1 to CS4 located on the wiring layer M1 through via conductors 191 to 194, respectively. The column selection lines CS1 to CS4 are wirings supplied with the column selection signal CS shown in FIG. 3. The local I/O lines LIO11 to LIO14 and the local I/O lines LIO21 to LIO24 are same in locations in the Y direction and extend in lines in the X direction, respectively. However, the local I/O lines LIO11 to LIO14 and the local I/O lines LIO21 to LIO24 are not short-circuited with each other and are divided by the I/O break region 43. The circuit region A2 is free from the local I/O lines LIO11 to LIO14 and the circuit region A1 is free from the local I/O lines LIO21 to LIO24.

Figure 6A:
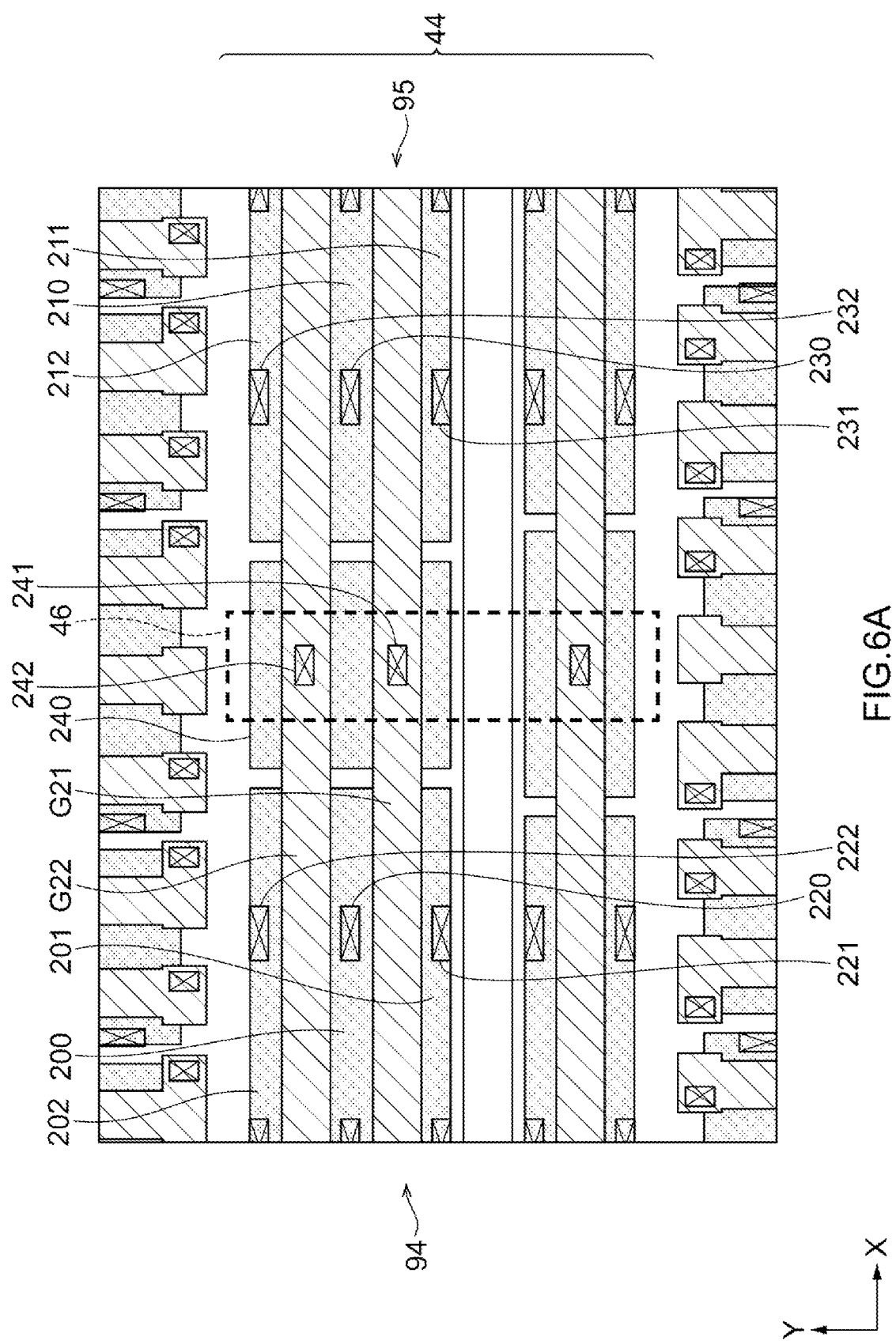
FIGS. 6A to 6D are plan views for explaining a layout of a region shown in FIG. 2 and a peripheral area.
Figure 6B:
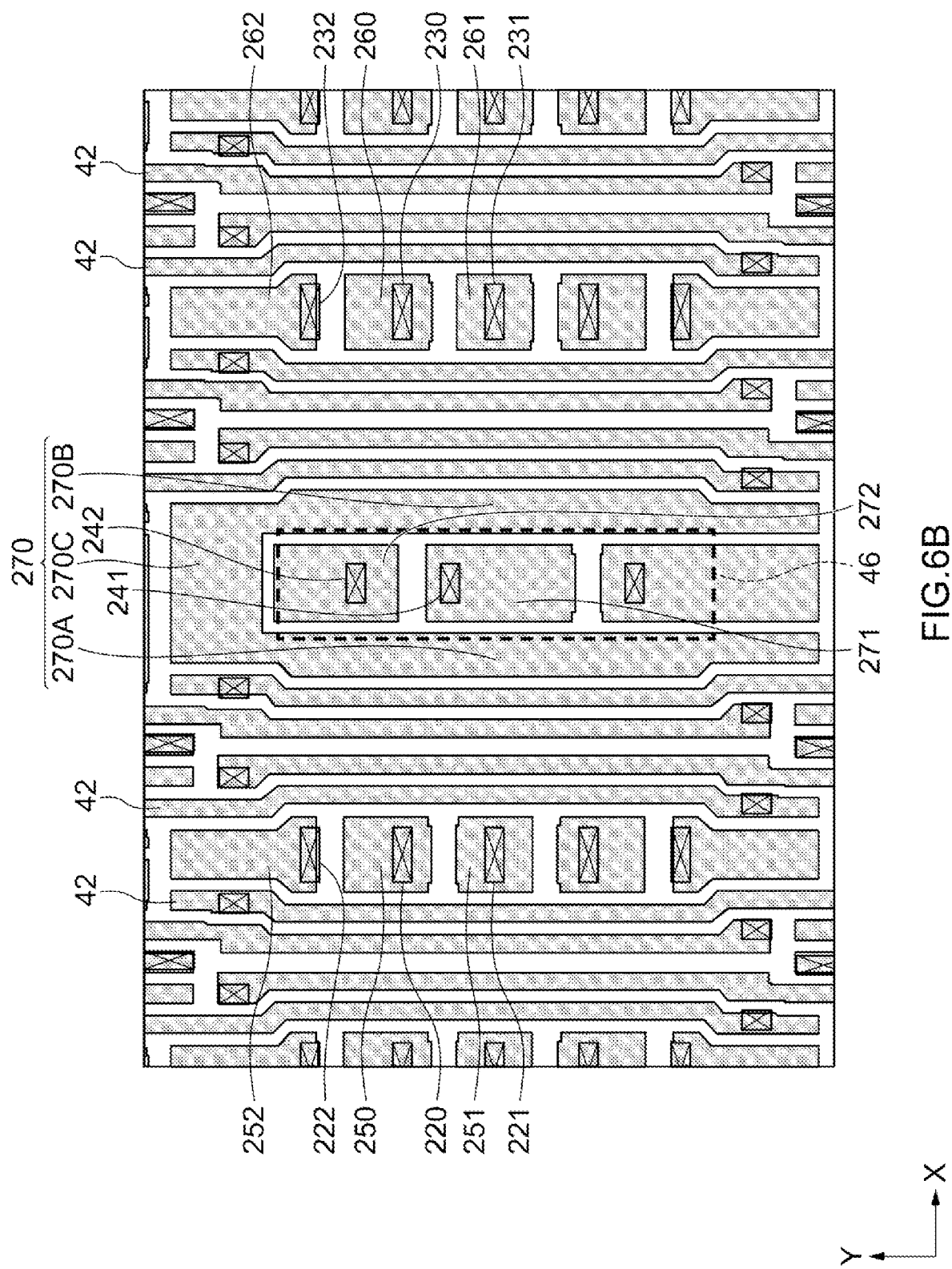
Figure 6C:
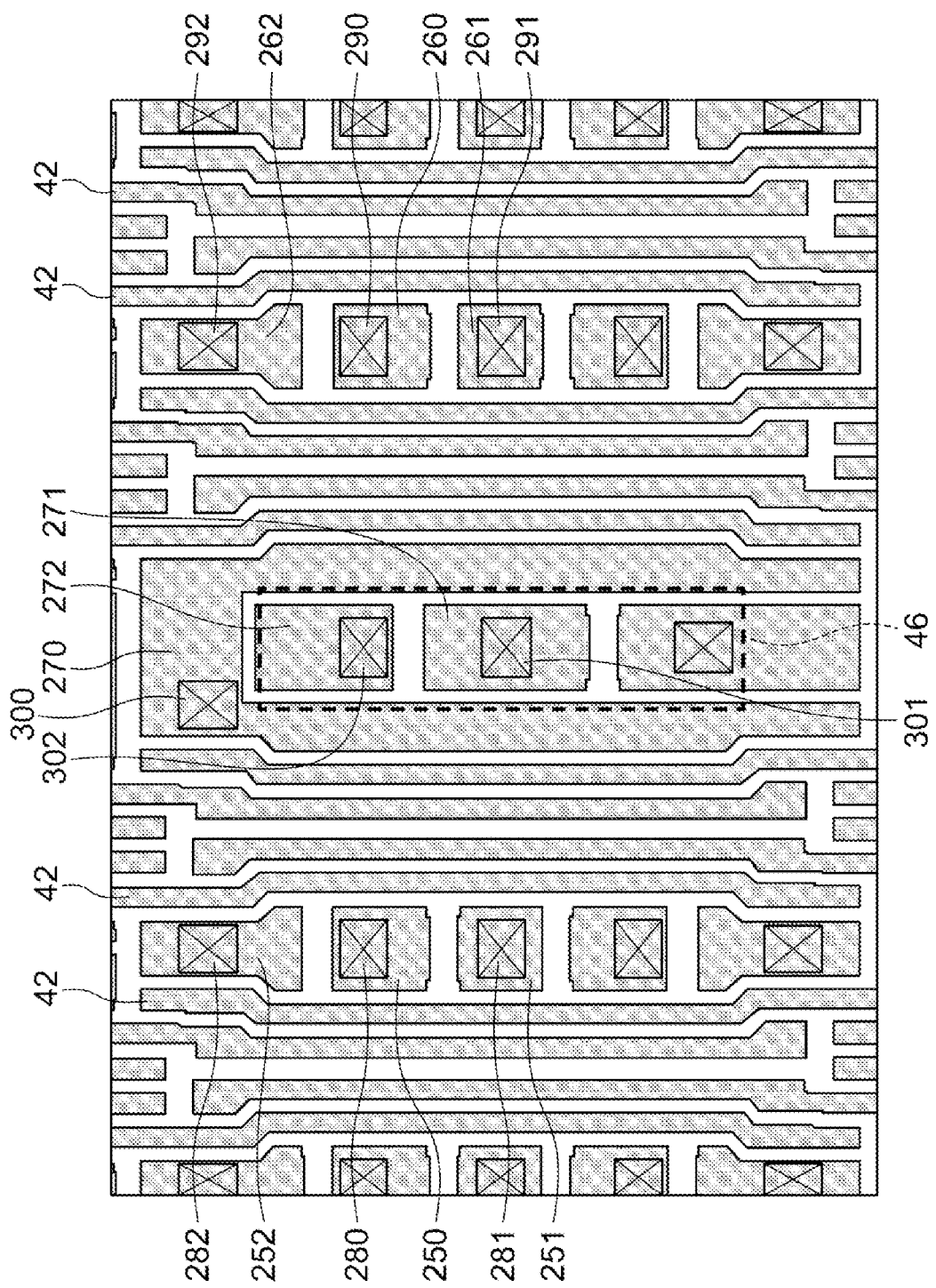
Figure 6D:
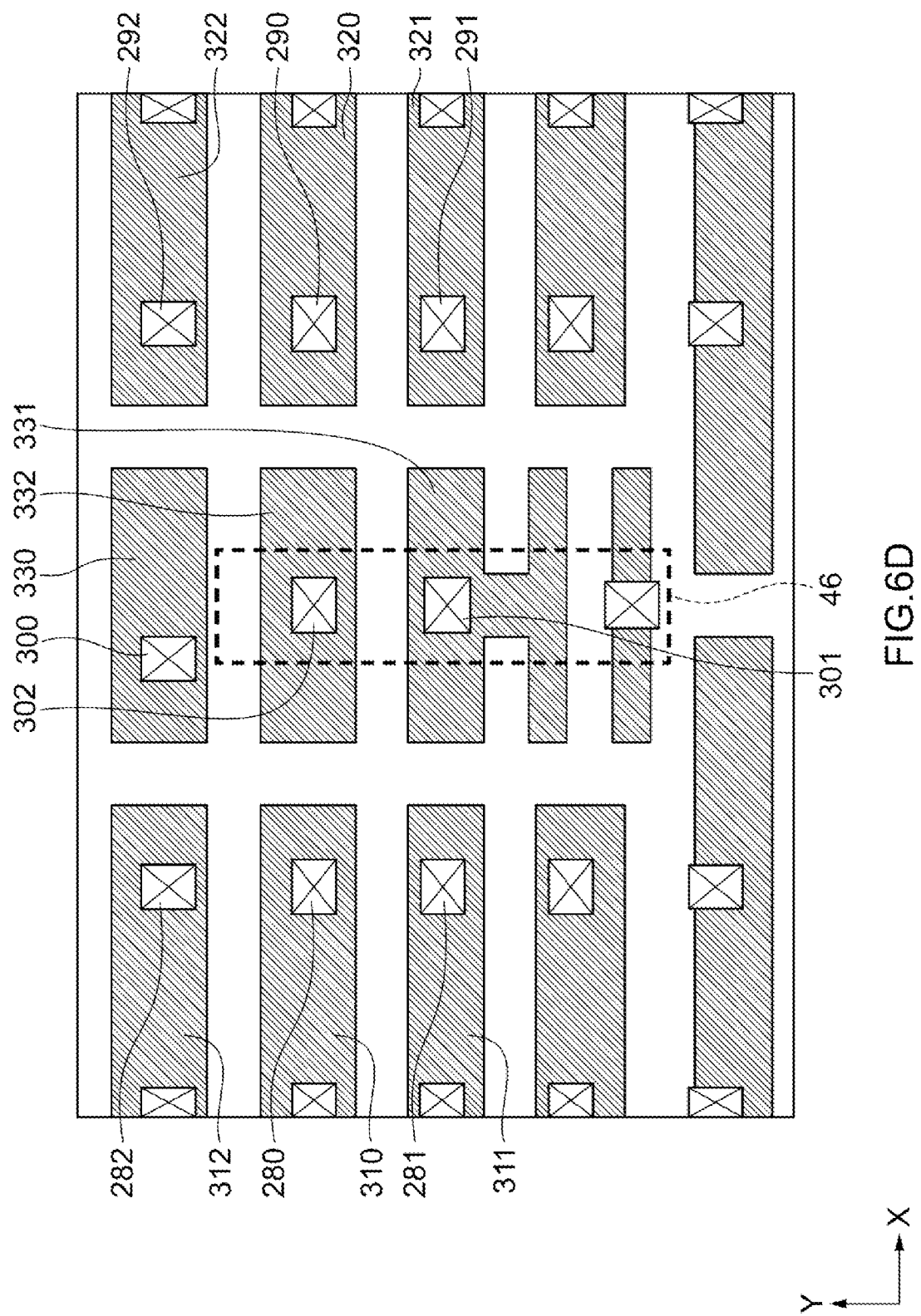

FIGS. 6A to 6D are plan views for explaining a layout of a region 46 shown in FIG. 2 and a peripheral area. The region 46 is at a location where the I/O break region 43 crosses the driver region 44. FIG. 6A shows a layout of diffusion layers and gate electrodes, FIGS. 6B and 6C show a layout of the wiring layer M0, and FIG. 6D shows a layout of the wiring layer M1. Via conductors coupling the wiring layer M0 to the diffusion layers or the gate electrodes are shown in FIG. 6B, and via conductors coupling the wiring layer M0 to the wiring layer M1 are shown in FIG. 6C.

As shown in FIG. 6A, an active region 94 provided on the driver region 44 includes a source region 200 and drain regions 201 and 202. Conversely, the regions 201 and 202 may be source regions and the region 200 may be a drain region. A gate electrode G21 is arranged between the source region 200 and the drain region 201 in a planar view. A gate electrode G22 is arranged between the source region 200 and the drain region 202 in the planar view. The gate electrodes G21 and G22 are the gate electrodes of the transistors 61 and 62 shown in FIG. 3, respectively. The source region 200 and the drain regions 201 and 202 are coupled to the wiring layer M0 through via conductors 220 to 222, respectively. Similarly, an active region 95 provided on the driver region 44 includes a source region 210 and drain regions 211 and 212. Conversely, the regions 211 and 212 may be source regions and the region 210 may be a drain region. The gate electrode G21 is arranged between the source region 210 and the drain region 211 in the planar view. The gate electrode G22 is arranged between the source region 210 and the drain region 212 in the planar view. The source region 210 and the drain regions 211 and 212 are coupled to the wiring layer M0 through via conductors 230 to 232, respectively. A dummy active region 240 is arranged between the active region 94 and the active region 95. The gate electrodes G21 and G22 are coupled to the wiring layer M0 through via conductors 241 and 242 provided at locations overlapping with the dummy active region 240, respectively.

As shown in FIG. 6B, conductive patterns 250 to 252, 260 to 262, and 270 to 272 and a plurality of bit lines 42 extending in the Y direction are provided on the wiring layer M0 arranged in the driver region 44. The conductive patterns 250 to 252 are coupled to the source region 200 and the drain regions 201 and 202 through the via conductors 220 to 222, respectively. The conductive patterns 260 to 262 are coupled to the source region 210 and the drain regions 211 and 212 through the via conductors 230 to 232, respectively. The conductive patterns 271 and 272 are coupled to the gate electrodes G21 and G22 through the via conductors 241 and 242, respectively. The conductive pattern 270 surrounds the conductive patterns 271 and 272 from both sides in the X direction and one side in the Y direction. The conductive pattern 270 includes sections 270A, 270B, and 270C. The sections 270A and 270B extend in the Y direction and are positioned between adjacent bit lines 42 and the conductive patterns 271 and 272, respectively, with the conductive patterns 271 and 272 sandwiched between the sections 270A and 270B. The sections 270A and 270B have shapes along the layout of the adjacent bit lines 42 and each include a section being wider in the width in the X direction and a section being narrower in the width in the X direction. The section 270C connects one end of the section 270A in the Y direction and one end of the section 270B in the Y direction to each other, resulting in section 270C bridged between sections 270A and 270B. The other ends of the sections 270A and 270B in the Y direction are open. Since the conductive pattern 270 that is at least partially surrounding the conductive patterns 271 and 272 is provided in this way on the wiring layer M0, the conductive patterns 271 and 272 are not directly adjacent to the bit lines 42.

As shown in FIGS. 6C and 6D, the conductive patterns 250 to 252 and 260 to 262 provided on the wiring layer M0 are coupled to wiring patterns 310 to 312 and 320 to 322 located on the wiring layer M1 through via conductors 280 to 282 and 290 to 292, respectively. The wiring patterns 311, 312, 321, and 322 correspond to the power supply line V1 shown in FIG. 3 and are supplied with the array potential VARY. The wiring patterns 310 and 320 correspond to sources of the transistors 61 and 62 shown in FIG. 3, respectively. The conductive patterns 270 to 272 provided on the wiring layer M0 are coupled to wiring patterns 330 to 332 located on the wiring layer M1 through via conductors 300 to 302, respectively. A fixed potential such as the ground potential VSS is supplied to the wiring pattern 330. The control signals PSA1 and PSA2 are supplied to the wiring patterns 331 and 332, respectively. The via conductor 300 is provided on the section 270C of the conductive pattern 270.

As described above, the control signals PSA1 and PSA2 for activating the sense amplifiers 41 are supplied to the gate electrodes G21 and G22, respectively, in a state shielded by the conductive pattern 270 on the wiring layer M0. That is, coupling between the conductive patterns 271 and 272 respectively supplied with the control signals PSA1 and PSA2, and the bit lines 42 can be prevented by the conductive pattern 270. Accordingly, the control signals PSA1 and PSA2 do not become a noise source for the bit lines 42 even through the active regions 94 and 95 are arranged in the center of the driver region 44 in the X direction as shown in FIG. 4 for the purpose of reducing the resistance of lines connecting the transistors 61 and 62 shown in FIG. 3 and the transistors 51 and 52 included in the sense amplifier 41, and therefore a reduction in the sense margin does not occur. Furthermore, since the control signals PSA1 and PSA2 supplied to the active regions 90 to 93 are connected to the gate electrodes outside the sense amplifier region 40, the control signals PSA1 and PSA2 supplied to the active regions 90 to 93 do not become a noise source for the bit lines 42. Meanwhile, the control signals NSA1 and NSA2 are directly adjacent to the bit lines 42 in the X direction without being shielded on the wiring layer M0. That is, the conductive patterns on the wiring layer M0 respectively supplied with the control signals NSA1 and NSA2 are sandwiched between adjacent two bit lines 42 without a shield pattern on the wiring layer M0 interposed therebetween.

Figure 7A:
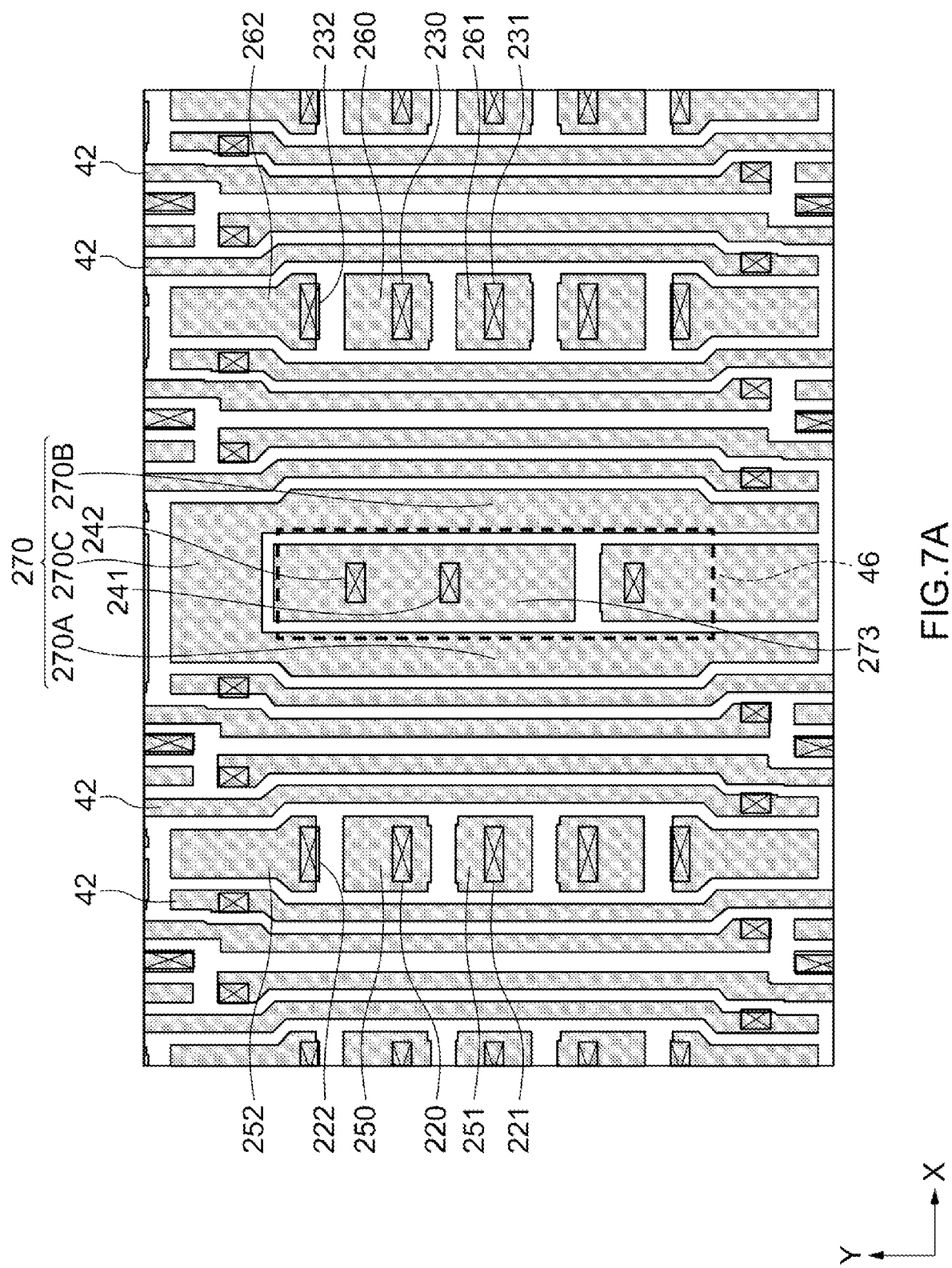
FIG. 7A is a plan view for explaining a layout according to an embodiment of the disclosure for the region shown in FIG. 2 and a peripheral area.
Figure 7B:
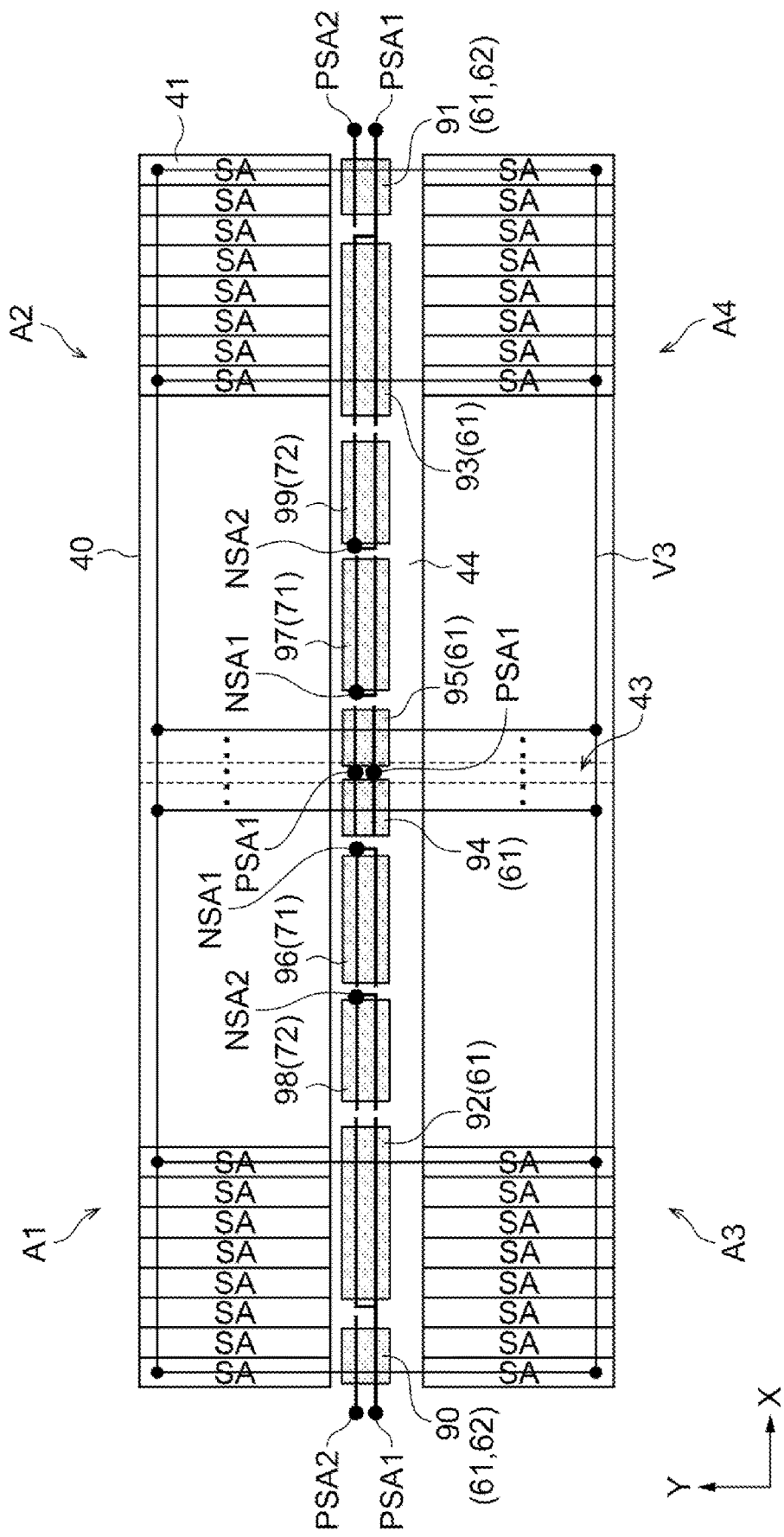
FIG. 7B is a schematic diagram for explaining a layout of transistors according to the embodiment of the disclosure of FIG. 7A.

In the above example, the control signals PSA1 and PSA2 are supplied to the gate electrodes G21 and G22, respectively. However, the control signal PSA1 may be supplied to both of the gate electrodes G21 and G22. This enhances drive performance of the transistor 61. In this case, it suffices that a conductive pattern 273 to which the via conductors 241 and 242 are coupled in common is provided on the wiring layer M0 and that the conductive pattern 273 is surrounded by the conductive pattern 270 serving as a shield as shown in FIG. 7A. When the control signal PSA1 is supplied to both of the gate electrodes G21 and G22, the transistor 62 is not located in a central part of the driver region 44 in the X direction. However, since a common source wiring V3 coupling the transistor 61 to the transistors 51 and 52 included in the sense amplifier 41 is formed in a mesh manner as shown in FIG. 7B, the wiring resistance between the transistor 62 and the transistors 51 and 52 can be sufficiently reduced. Alternatively, the gate electrodes G21 and G22 may be supplied with the control signals NSA1 and NSA2, respectively, instead of the control signals PSA1 and PSA2.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

The invention claimed is:

1. An apparatus comprising:
    a first bit line in a first wiring layer, the first bit line coupled to a first sense amplifier;
    a second bit line in the first wiring layer, the second bit line coupled to a second sense amplifier;
    a first conductive pattern in the first wiring layer, the first conductive pattern configured to receive a first control signal to supply the first sense amplifier and the second sense amplifier with a first voltage; and
    a shield conductive pattern in the first wiring layer, the shield conductive pattern partially surrounding the first conductive pattern to electrically shield the first conductive pattern from the first bit line and the second bit line.

2. The apparatus of claim 1, wherein the shield conductive pattern has a first segment between the first bit line and the first conductive pattern and a second segment between the second bit line and the first conductive pattern.

3. The apparatus of claim 2, wherein the shield conductive pattern further has a third segment bridged between the first segment and the second segment.

4. The apparatus of claim 1, further comprising:
    a third bit line in the first wiring layer, the third bit line coupled to a third sense amplifier;
    a fourth bit line in the first wiring layer, the fourth bit line coupled to a fourth sense amplifier; and
    a second conductive pattern in the first wiring layer, the second conductive pattern configured to receive a second control signal to supply the third sense amplifier and the fourth sense amplifier with a second voltage;
    wherein the third bit line and fourth bit line are directly adjacent to the second conductive pattern without being shielded.

5. The apparatus of claim 4, wherein the second voltage is further supplied to the first sense amplifier and the second sense amplifier responsive to the second control signal and the first voltage is further supplied to the third sense amplifier and the fourth sense amplifier responsive to the first control signal.

6. The apparatus of claim 4, wherein the first voltage is greater in absolute value than the second voltage.

7. An apparatus comprising:
    a first wiring layer including a first bit line extending in a first direction;
    a first sense amplifier configured to amplify a potential of the first bit line; and
    a first transistor configured to supply an operation voltage to the first sense amplifier when a first control signal supplied to a gate electrode of the first transistor is activated,
    wherein the first wiring layer further includes a first pattern coupled to the gate electrode of the first transistor and a second pattern having a first section arranged between the first bit line and the first pattern in a second direction perpendicular to the first direction.

8. The apparatus of claim 7, wherein the gate electrode of the first transistor extends in the second direction so as to cross the first bit line and the first section of the second pattern.

9. The apparatus of claim 7,
    wherein the first wiring layer further includes a second bit line extending in the first direction,
    wherein the apparatus further comprises a second sense amplifier configured to amplify a potential of the second bit line and a second transistor including a gate electrode supplied with the first control signal and configured to supply the operation voltage to the second sense amplifier when the first control signal is activated,
    wherein the first pattern is further coupled to the gate electrode of the second transistor, and
    wherein the second pattern further has a second section arranged between the second bit line and the first pattern in the second direction.

10. The apparatus of claim 9, wherein the first pattern is sandwiched between the first and second sections of the second pattern in the second direction.

11. The apparatus of claim 10, wherein the gate electrode of the second transistor extends in the second direction so as to cross the second bit line and the second section of the second pattern.

12. The apparatus of claim 9, further comprising a third transistor configured to supply the operation voltage to the first sense amplifier when a second control signal supplied to a gate electrode of the third transistor is activated,
    wherein the first wiring layer further includes a third pattern arranged adjacent to the first pattern in the first direction such that the first section of the second pattern is arranged between the first bit line and the first and third patterns in the second direction, and
    wherein the third pattern is coupled to the gate electrode of the third transistor.

13. The apparatus of claim 12, further comprising a fourth transistor including a gate electrode supplied with the second control signal and configured to supply the operation voltage to the second sense amplifier when the second control signal is activated,
    wherein the third pattern is further coupled to the gate electrode of the fourth transistor, and
    wherein the second section of the second pattern is arranged between the second bit line and the first and third patterns in the second direction.

14. The apparatus of claim 9, further comprising first and second local I/O lines extending in the second direction so as not to overlap each other in the first direction,
    wherein the first wiring layer includes a first bit line group including the first bit line and a second bit line group including the second bit line, wherein the first local I/O line is coupled in common to at least parts of the first bit line group, and wherein the second local I/O line is coupled in common to at least parts of the second bit line group.

15. The apparatus of claim 14, wherein the first and second local I/O lines extend in line in the second direction via an I/O break region, and wherein the I/O break region and the first pattern are arranged in the first direction.

16. The apparatus of claim 7, wherein the second pattern is supplied with a power potential.

17. An apparatus comprising:

a plurality of first sense amplifiers arranged in a first direction on a first circuit region;

a plurality of second sense amplifiers arranged in the first direction on a second circuit region;

a plurality of first local I/O lines each coupled to associated ones of the first sense amplifiers, the plurality of first local I/O lines extending in the first direction on the first circuit region such that the second circuit region being free from the plurality of first local I/O lines;

a plurality of second local I/O lines each coupled to associated ones of the second sense amplifiers, the plurality of second local I/O lines extending in the first direction on the second circuit region such that the first circuit region being free from the plurality of second local I/O lines;

a first transistor coupled between a power supply line and the plurality of first and second sense amplifiers; and a first conductive pattern covering and coupled to a gate electrode of the first transistor, wherein the first conductive pattern is arranged on an I/O break region between the first and second circuit regions in the first direction.

18. The apparatus of claim 17, further comprising:

a plurality of first bit lines extending in a second direction perpendicular to the first direction and arranged in the first direction on the first circuit region, each of the plurality of first bit lines being coupled to an associated one of the plurality of first sense amplifiers;

a plurality of second bit lines extending in the second direction and arranged in the first direction on the second circuit region, each of the plurality of second bit lines being coupled to an associated one of the plurality of second sense amplifiers; and a second conductive pattern, wherein the first conductive pattern, the second conductive pattern, the plurality of first bit lines, and the plurality of second bit lines are located on a first wiring layer, and wherein the second conductive pattern are arranged between the first conductive pattern and the plurality of first and second bit lines.

19. The apparatus of claim 18, further comprising:

a second transistor coupled between the power supply line and the plurality of first and second sense amplifiers; and a third conductive pattern covering and coupled to a gate electrode of the second transistor, wherein the third conductive pattern is located on the first wiring layer, and wherein the third conductive pattern is arranged on the I/O break region such that the second conductive pattern are arranged between the third conductive pattern and the plurality of first and second bit lines.

20. The apparatus of claim 18, wherein the second conductive pattern is supplied with a power potential.

21. An apparatus comprising:

first and second bit lines extending in a first direction and arranged in a second direction perpendicular to the first direction;

a first sense amplifier coupled to the first bit line;

a second sense amplifier coupled to the second bit line;

a first conductive pattern arranged between the first and second bit lines, the first conductive pattern being supplied with a control signal that activates the first and second sense amplifiers in common; and a second conductive pattern supplied with a power potential, the second conductive pattern at least partially surrounding the first conductive pattern such that the first conductive pattern is not adjacent to the first and second bit lines.

22. The apparatus of claim 21, wherein the second conductive pattern includes:

a first section extending in the first direction and arranged between the first conductive pattern and the first bit line in the second direction; and a second section extending in the first direction and arranged between the first conductive pattern and the second bit line in the second direction.

23. The apparatus of claim 22, wherein the second conductive pattern further includes a third section connected between the first and second sections.

24. The apparatus of claim 23, further comprising a via conductor that supplies the power potential to the second conductive pattern, wherein the via conductor is in contact with the third section of the second conductive pattern.

25. The apparatus of claim 23, wherein the third section is connected to one end of the first and second sections in the first direction, and wherein another end of the first and second sections in the first direction are terminated such that the second conductive pattern does not completely surround the first conductive pattern.

26. The apparatus of claim 22, wherein each of the first and second sections of the second conductive pattern includes a wide section and a narrow section narrower in pattern width in the second direction than the wide section.

* * * * *